United States Patent [19]

Jennings et al.

[11] 4,134,447
[45] Jan. 16, 1979

[54] THERMAL COMPENSATOR FOR CLOSED-CYCLE HELIUM REFRIGERATOR

[76] Inventors: Robert A. Frosch, Administrator of the National Aeronautics and Space Administration, with respect to an invention of Donald E. Jennings, Greenbelt; John J. Hillman, Lanham, both of Md.

[21] Appl. No.: 838,337

[22] Filed: Sep. 30, 1977

[51] Int. Cl.² ............................................. H01B 7/34
[52] U.S. Cl. .............................. 165/30; 62/514 R; 174/15 CA; 250/352
[58] Field of Search ............ 236/1 F; 62/514 R, 202, 62/514 JT; 165/30; 174/15 CA; 250/352

[56] References Cited

U.S. PATENT DOCUMENTS 3,195,620  7/1965  Steinhardt, Jr. ...................... 165/30

*Primary Examiner*—William E. Wayner
*Attorney, Agent, or Firm*—Robert D. Marchant; John R. Manning; John O. Tresansky

[57] ABSTRACT

The wave length of an infrared, semiconductor laser diode having an output frequency that is dependent on the diode temperature is maintained substantially constant by maintaining the diode temperature constant. The diode is carried by a cold tip of a closed cycle helium refrigerator. The refrigerator has a tendency to cause the temperature of the cold tip to oscillate. A heater diode and a sensor diode are placed on a thermal heat sink that is the only highly conductive thermal path between the laser diode and the cold tip. The heat sink has a small volume and low thermal capacitance so that the sensing diode is at substantially the same temperature as the heater diode and substantially no thermal lag exists between them. The sensor diode is connected in a negative feedback circuit with the heater diode so that the tendency of the laser diode to thermally oscillate is virtually eliminated.

16 Claims, 2 Drawing Figures

THERMAL COMPENSATOR FOR CLOSED-CYCLE HELIUM REFRIGERATOR

ORIGIN OF THE INVENTION

The invention described herein was made in the performance of work under a NASA contract and by an employee of the U.S. Government and is subject to the provisions of Section 305 of the National Aeronautics and Space Act of 1958, Public Law 85-568 (72 Stat. 435; 42 USC 2457), and may be manufactured and used by or for the Government for governmental purposes without the payment of any royalties thereon or therefor.

BACKGROUND OF THE INVENTION

The present invention relates generally to apparatus for maintaining a load of a closed cycle helium refrigerator substantially constant and, more particularly, to such an apparatus wherein temperature variations of the refrigerator and load are compensated by sensing the temperature variations and supplying compensating, oscillating thermal energy to the refrigerator and the load.

In certain very high resolution infrared spectroscopy applications, it is necessary to provide an infrared source having a very stable output frequency. In one particular application, it is desired to provide a source that generates optical lines over only a 5 mHz band width. The resolution required to achieve such a band width can be appreciated when it is realized that the frequency of a typical IR emitter is between approximately $10^{12}$ and $10^{14}$ Hz.

It has been proposed to employ semiconductor diode lasers as high resolution infrared sources in connection with high resolution infrared spectroscopy devices. However, such sources have an output that is relatively dependent upon the temperature of the semiconductor diode. One particular type of semiconductor diode laser has been found to have a tuning rate of 30 gHz per degree Kelvin, i.e., the output frequency of the laser shifts 30 gHz for each degree Kelvin change in the temperature of the laser. To stabilize the output frequency of such a laser to 5 mHz, it is necessary to stabilize the temperature of the laser to within $1.6 \times 10^{-4}$°K.

A device that has been frequently employed in the past to stabilize the temperature of semiconductor diode IR lasers has been a closed-cycle helium refrigerator. By mounting the diode laser on a cold tip of the closed cycle helium refrigerator, the temperature of the diode is maintained to approximately 0.4° K., which results in an output band spread of approximately 12 gHz. One of the reasons why there is a relatively large temperature variation in the diode laser is because the closed cycle helium refrigerator periodically pumps helium at 3 Hz to cause a cyclic rate of heat transfer to the cold tip and the diode.

To reduce the 0.4° K. variation substantially, the sample has been isolated from the cold tip with a temperature attenuator formed of a layer of a material or combination of materials which effectively attenuate the amplitude of the temperature oscillations occurring due to the cyclic nature of the refrigerator. The temperature attenuator has the disadvantage of causing the minimum temperature of the thermally isolated diode to be always higher, by a few degrees Kelvin, than the temperature of the cold tip. If there is not a significant temperature difference between the cold tip and the diode, there is not a significant enough reduction of the amplitude of the temperature oscillations. However, the use of a large quantity of the attenuator materials causes the thickness of the attenuator to be increased until the temperature of the diode may not be low enough to emit wave lengths of interest. Hence, in actuality the thermal attenuator, while it provides the desired compensation, is not wholly satisfactory because the desired temperature range for the laser may not be achieved.

SUMMARY OF THE INVENTION

In accordance with the present invention, the temperature of a load mounted on a cold tip of a closed cycle helium refrigerator is maintained relatively constant by mounting a heating diode and a temperature sensor on the cold tip and establishing a feedback loop between the sensor and the diode to compensate for cyclic temperature variations of the refrigerator. Preferably, the heater and sensor are mounted on a heat sink so that the only highly conductive thermal path between the load and the cold tip is through the heat sink. Also, the heat sink has a small volume and low thermal capacitance so that the sensor is at substantially the same temperature as the heater and virtually no thermal phase lag exists between the heater and sensor. By preventing phase lags between the heater and sensor, the heater compensates for temperatue variations of the cold tip the load, and there is ideally a 180° phase relationship between the temperatures of the heater and sensor.

Preferably, the heater and sensor are semiconductor diodes that are back biased by constant current sources. The constant current source driving the heater diode is programmable to enable the wave length, i.e., frequency, of a semiconductor diode laser, which is preferably the refrigerator load, to be controlled in response to the temperature variations sensed by the sensor. Because the preferred load is a semiconductor diode infrared emitting laser, the refrigerator load has a tendency to heat the cold tip in response to the currents flowing through the laser diode.

By utilizing a semiconductor heater diode, there is active thermal compensation for the thermal oscillations of the closed cycle helium refrigerator. Further, the semiconductor heater and sensor diodes have rapid response times to enable thermal lags between the laser diode, heater diode and sensor diode to be virtually eliminated.

It is, accordingly, an object of the present invention to provide a new and improved device for compensating the cyclic variations that a load, particularly a laser semiconductor diode, of a closed cycle helium refrigerator undergoes.

Another object of the invention is to provide a new and improved apparatus for maintaining the temperature of a semiconductor, laser diode relatively constant so that the diode is capable of emitting an infrared beam having a wave length that does not vary over more than 5 mHz.

A further object of the invention is to provide a new and improved control apparatus for a closed cycle helium refrigerator wherein cyclic variations of the refrigerator are compensated to within $1.6 \times 10^{-4}$°K.

The above and still further objects, features and advantages of the present invention will become apparent upon consideration of the following detailed description of one specific embodiment thereof, especially when taken in conjunction with the accompanying drawing.

BRIEF DESCRIPTION OF THE DRAWING

In the drawings where identical parts are designated by the same references.

DESCRIPTION OF THE PREFERRED EMBODIMENT

Figure 1:
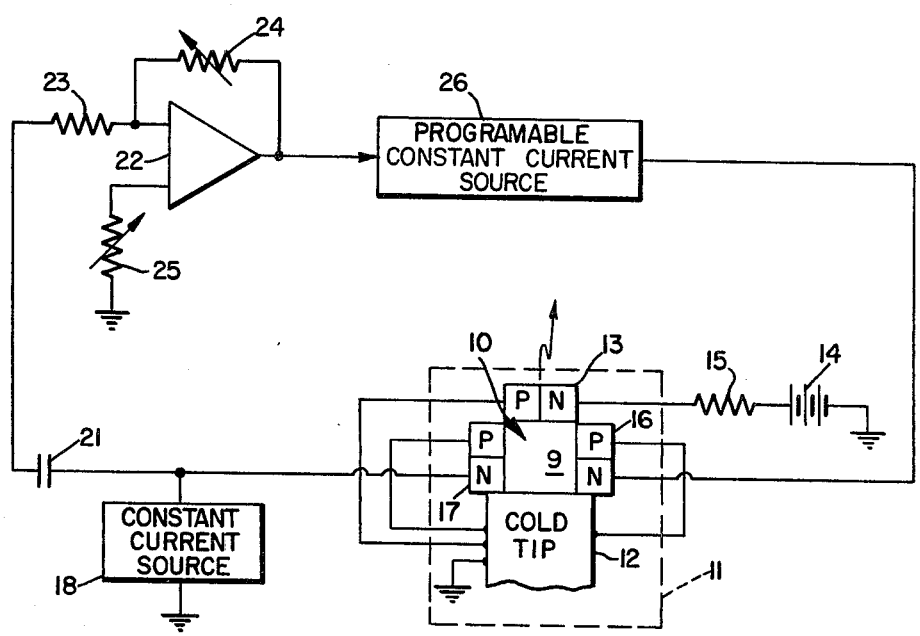
FIG. 1 is a schematic diagram of the present invention.

Reference is now made to FIG. 1 of the drawing wherein there is illustrated a closed cycle, vacuum, helium refrigerator 11 having a relatively small cold tip 12, which is the coldest part of the refrigerator. Refrigerator 11 maintains cold tip 12 at a cryogenic temperature, in the range of approximately 9° K. to 70° K. The closed cycle helium refrigerator is a commercially available device, such as an Air Products closed cycle helium refrigerator, Model CS202. Cold tip 12 is formed of a highly heat conductive material, such as a mass of copper that is coated with silver.

A load to be cooled by refrigerator 11 is mounted on cold tip 12. A typical load is a semiconductor, laser diode 13, which emits energy in the infrared region at a frequency dependent upon the temperature of the diode. Diode 13 is back biased by a suitable DC power supply, as illustrated by DC source 14 and resistor 15.

In accordance with an important aspect of the invention, diode 13 and cold tip 12 are in a highly thermally conductive path, established by a mount, generally indicated by numeral 10, that includes heat sink 9 which carries heater diode 16 and temperature sensing diode 17. Diode 13 generates heat in response to the current flowing through it due to its excitation by the DC power supply 14 and diode 16 generates compensating oscillatory heat components, as described infra. Because of the construction of mount 10 and heat sink 9, there are virtually no thermal shunt paths between diode 13 and cold tip 12 around the thermal conduction path through heat sink 9.

Because of the nature of refrigerator 11, cold tip 12 is cyclically cooled by the refrigerator at a frequency of approximately 3Hz. The cyclic cooling of cold tip 12 has a tendency to cause diode 13 to be cyclically cooled and heated. It is the function of diode 16 to compensate for the cyclic cooling and heating of diode 13 by cold tip 12. To this end, a negative feedback loop is provided between sensing diode 17 and heater diode 16. The negative feedback loop causes diode 16 to be heated in an out of phase relationship with the cooling of cold tip 12. Sensing semiconductor diode 17 is mounted on heat sink 9 so that the sensing diode is at substantially the same temperature as heater diode 16 and substantially no thermal phase lag exists between laser heater diode 16 and sensor diode 17, a result achieved by minimizing the volume of heat sink 9 between the heater and sensor diodes.

The impedance of sensor diode 17 varies inversely as a function of the temperature of the sensor diode. To monitor the impedance, and therefore the temperature of diode 17, constant current source 18 is connected across the sensor diode to back bias it. Thereby, the voltage developed across the sensor diode is indicative of the temperature of the sensor diode. Because of the temperature versus impedance relationship of sensor diode 17, the voltage across the sensor diode is directly indicative of the temperature of the diode, i.e., as the temperature of sensor diode 17 increases, the voltage across the diode increases.

To monitor only AC fluctuations of diode 17, the negative feedback loop includes a series coupling capacitor 21 that is connected to an input of DC operational amplifier 22 by resistor 23. A variable resistor 24 is connected in a DC negative feedback path of amplifier 22, between the output and input of the amplifier, to control the gain of the amplifier and the feedback loop. In addition, amplifier 22 includes a variable DC bias circuit including variable resistor 25 that controls the DC level of the output of amplifier 22.

The DC output voltage of amplifier 22 is controlled by resistor 25 to establish a DC level for the current supplied to heater diode 16 and therefore the average temperature of laser diode 13, to control the emission frequency of the diode. To control the DC and AC current levels supplied to heater diode 16 in response to the output of amplifier 22, the output of the amplifier is coupled to programmable, constant current source 26. Constant current source 26 supplies a controlled back biasing current to diode 16. The current derived from source 26 is a replica of the voltage derived from sensor diode 17 so that the temperature of heater diode 16 decreases as the temperature of sensor diode 17 increases in response to the oscillation of cold tip 12. This is because the temperature of heater diode 16 decreases in response to decreases in the level of current derived from programmable current source 26, which in turn is controlled by AC variations in the voltage developed across diode 17. Typically, the current derived from source 26 is approximately 0.1 ampere and the current derived from source 26 has virtually zero ripple. A suitable constant current source can be obtained from Arthur D. Little Co. and designated as Model SCPS-II. Constant current source 18 also has virtually zero ripple and supplies a current on the order of 10 microamperes to sensor diode 17; such a power supply is available from Lake Shore Cryotronics and is designated as Model DTC-500.

In operation, the current in heater diode 16 causes Joule heating in the diode junction, thereby applying heat to cold tip 12 and laser diode 13 to compensate for the heat loss of the cold tip during the temperature oscillations of refrigerator 11. A slight increase in the output voltage of temperature sensor 17, corresponding to a decrease in the temperature of the colt tip, causes the current to increase in heater diode 16, and the resulting heat generated by diode 16 cancels the temperature change of colt tip 12 and laser diode 13. The gain of amplifier 22 is adjusted for optimum cancellation, and the average rate of heat supplied by diode 16 is set by adjusting zero offset resistor 25 of amplifier 22 to controll the DC level derived from source 26.

Figure 2:
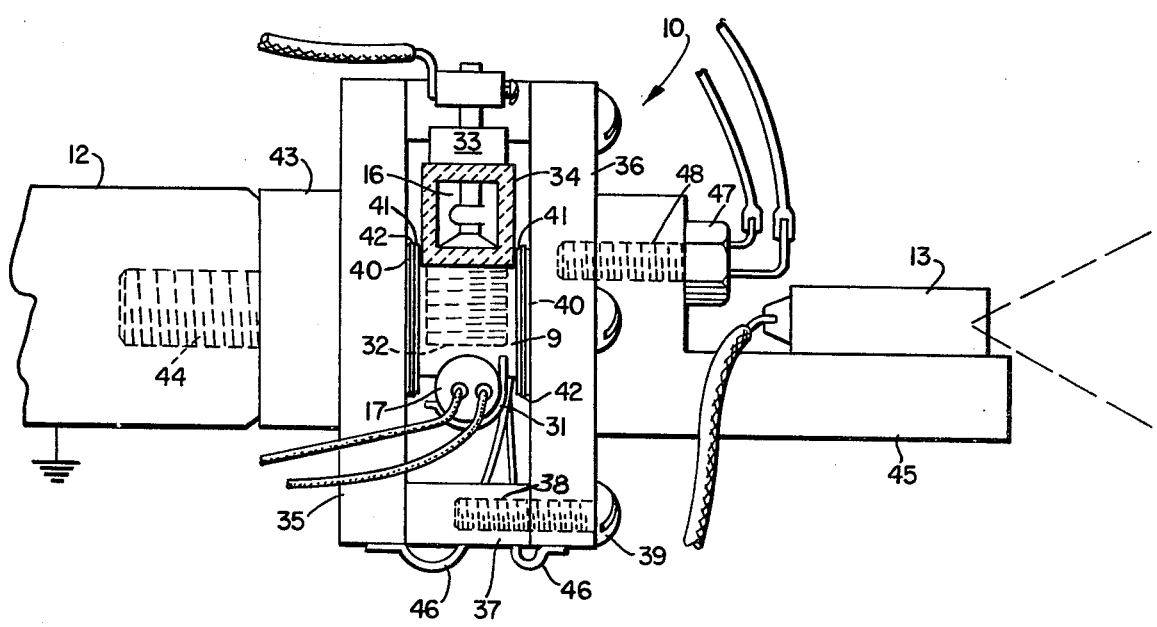
FIG. 2 is a view of the apparatus, in accordance with the present invention, included inside of the closed cycle helium refrigerator.

Reference is now made to FIG. 2 of the drawing wherein details of heat sink 9, mount 10, cold tip 12, laser diode 13, heater diode 16 and temperature sensing diode 17 are illustrated. All of the parts illustrated in FIG. 2 are copper, unless otherwise indicated, and therefore have high thermal and electrical conductivity.

Heat sink 9 is formed as a cube having a relatively small volume and therefore low thermal capacitance, with each edge of the cube having a length of approximately ⅛ inch. Temperature sensing diode 17 is fixedly mounted in a groove on one face of heat sink 9 and is held in situ by spring clip 31. Mounted on the opposite face of heat sink 9 is heater diode 16, having a threaded, copper anode 32 that is received in a threaded bore of heat sink 9. Heat generated by diode 16, which includes cathode 33 that is connected to the negative power supply of source 18, flows into heat sink 9 through anode 32. Diode 16 is a conventional microwave diode that is contained in a ceramic housing 34.

The parallel faces of heat sink 9 at right angles to the faces carrying diodes 16 and 17 abut against and are sandwiched between circular flanges 35 and 36. Flanges 35 and 36 maintain a compressive force on the parallel faces of heat sink 9 against which they abut because the flanges are connected to each other through four Teflon stand-offs 37 that are positioned at 90° with respect to each other around the periphery of the flanges. (To facilitate the drawing only one of the stand-offs is illustrated). Stand-offs 37 are fixedly mounted to the face of flange 35 facing heat sink 9 and include threaded bores 38 for receiving screws 39 that extend through bores in flange 36 to press the flanges firmly against the abutting faces of heat sink 9.

Thermal conduction and electrical insulation between the adjacent, parallel faces of flange 35 of heat sink 9 and between the corresponding faces between flange 36 and heat sink 9 are established, on both sides, through a sandwich arrangement including two indium wafers 40 and 41, between which is sandwiched a relatively thin Mylar layer 42, typically having a thickness of approximately 1 or 2 mils. Indium is a semiconductor metal having a relatively high thermal conductivity, while Mylar is a dielectric having low thermal conductivity. Mylar is readily deformable so that as screws 39 are tightened, indium wafers 40 and 41 come into intimate contact with virtually all portions of Mylar layer 42. Mylar layer 42 provides a high thermal impendance for the AC thermal variations at cold tip 12, but a low DC thermal impedance between flanges 35 and 36. Thereby, heat sink 9 has a tendency to be maintained at the same average temperature as cold tip 12 and the periodic variations of the cold tip have a tendency to be attenuated by Mylar layer 42. Similarly, heat sink 9 and diode laser 13 have a tendency to be maintained at the same average temperature and AC thermal variations between the heat sink and semiconductor, diode laser have a tendency to be reduced.

Flange 35 is integral with screw head 43, having a threaded stud 44 that is received by a threaded bore at the end of cold tip 12, while flange 36 is integral with L-shaped block 45 that carries laser 13.

Stand-offs 37 have very low thermal conductivity so that the only substantial low thermal, DC path between cold tip 12 and diode laser 13 is through heat sink 9. There is an additional thermal conductivity path from flanges 35 and 36 to heat sink 9 via metal wires 46 that provide an electrical ground path for one electrode of diode laser 13 to the electrically grounded cold refrigerator tip 12. However, wires 46 are so thin, being thirty-six gauge, that they have a high thermal impedance to prevent substantial thermal coupling between flanges 35 and 36; the length of each wire is approximately ¼ to ½ inch. Preferably wires 46 are fabricated of a special low temperature non-magnetic, copper phosphorus alloy that is available from Lake Shore Cryogenics and is designated as Catalog No. NM-36. Wires 46 are connected to heat sink 9 to assure that any heat conducted by the wires between flanges 35 and 36 flows through the heat sink to prevent a possible thermal short circuit around the heat sink.

Because of the close proximity between anode 32, heater diode 16 and temperature sensing diode 17 through the small volume of heat sink 9, diodes 16 and 17 are maintained at substantially the same temperature and there is no substantial thermal phase lag between them. Because thermal lag between diodes 16 and 17 is almost nil and the temperature of heat sink 9 has a tendency to remain constant, variations in the temperature of heat sink 9 and semiconductor diode laser 13 in response to the thermal variations of cold tip 12 are substantially eliminated. The AC, thermal fluctuations of cold tip 12 are effectively cancelled at heat sink 9, and the average, DC temperature level of the cold tip is coupled to diode laser 13. It has been determined that there is typically ½° centigrade, DC temperature difference between cold tip 12 and laser 13, with virtually complete cancellation of the AC variation of the cold tip at the laser. In one actual configuration, the DC temperature of the cold tip was 8.5° Kelvin and the temperature of laser 13 was 9° Kelvin.

To monitor the performance of the device, a calibrated temperature sensor 47 is mounted on block 45. Sensor 47 includes a threaded stud 48 that projects into aligned threaded bores of block 45 and flange 36 to sense the temperature of the flange and the block and provide an output signal to a suitable measuring device that enables the temperature of laser 13 to be accurately monitored.

While there has been described and illustrated one specific embodiment of the invention, it will be clear that variations in the details of the embodiment specifically illustrated and described may be made without departing from the true spirit and scope of the invention as defined in the appended claims.

What is claimed is:

1. In combination: a closed cycle helium refrigerator for maintaining a load at cryogenic temperatures, said refrigerator having a cold tip for receiving the load, said refrigerator having a tendency to cause the temperature of the cold tip and load to oscillate; a heater in a high conductivity thermal path with the cold tip; a temperature sensor in a high conductivity thermal path with the cold tip, the heater and the load so that the sensor is at substantially the same temperature as the heater and substantially no thermal phase lag exists between the heater and the sensor; and means for connecting the temperature sensor and the heater in a negative feedback circuit to compensate for temperature variations induced by the refrigerator in the load.

2. The combination of claim 1 further including a regulated constant current source for biasing the sensor so it derives a voltage indicative of the temperature of the cold tip, the impedance of the sensor changing as the temperature thereof changes, a DC amplifier, a capacitor connected between the sensor and DC amplifier to enable only AC fluctuations sensed by the sensor diode to be coupled to the amplifier, a programmable constant current source responsive to the output of the amplifier, said programmable current source deriving a current level proportional to amplitude of the voltage supplied to it by the amplifier, means for connecting the heater to be biased by the current derived from the current source so that the heater diode temperature varies in response to changes in the level of the current derived from the programmable current source, whereby the programmable current source derives a current that is a replica of an output signal of the sensor and the temperature of the heater diode decreases as the temperature of the load increases in response to the cold tip temperature oscillations.

3. The combination of claim 2 wherein said amplifier includes: a variable gain controller and means for adjusting the DC output level of the amplifier.

4. In combination: a closed cycle helium refrigerator for maintaining a load at cryogenic temperatures, said refrigerator having a cold tip for receiving the load, said refrigerator having a tendency to cause the temperature of the cold tip and load to oscillate; a heat sink connected between the load and the cold tip so that the only high conductivity thermal path between the load and the cold tip is through the heat sink; and, a temperature sensor and an electric heater carried by the heat sink to be in close proximity with each other so that the sensor is at substantially the same temperature as the heater and substantially no thermal phase lag exists between the heater and the sensor.

5. The combination of claim 4 further including means for connecting the temperature sensor and the heater in a negative feedback circuit to compensate for temperature variations induced by the refrigerator in the load.

6. The combination of claim 4 further including means for establishing a relatively high DC thermal conductivity path between the cold tip and the heat sink while establishing a relatively low AC thermal conductivity path between the cold tip and the heat sink.

7. The combination of claim 6 wherein the means for establishing includes a dielectric layer a thickness of approximately one or two mils.

8. The combination of claim 7 wherein the means for establishing further includes a pair of relatively plastic plates of high thermal conductivity between which the dielectric layer is sandwiched, and means for compressing the plates against the dielectric layer so that the plates and layer are in intimate contact.

9. The combination of claim 5 further including a regulated constant current source for biasing the sensor so it derives a voltage indicative of the temperature of the cold tip, the impedance of the sensor changing as the temperature thereof changes, a DC amplifier, a capacitor connected between the sensor and DC amplifier to enable only AC fluctuations sensed by the sensor diode to be coupled to the amplifier, a programmable constant current source responsive to the output of the amplifier, said programmable current source deriving a current level proportional to amplitude of the voltage supplied to it by the amplifier, means for connecting the heater to be biased by the current derived from the current source so that the heater diode temperature varies in response to changes in the level of the current derived from the programmable current source, whereby the programmable current source derives a current that is a replica of an output signal of the sensor and the temperature of the heater diode decreases as the temperature of the load increases in response to the cold tip temperature oscillations.

10. The combination of claim 9 wherein said amplifier includes: a variable gain controller and means for adjusting the DC output level of the amplifier.

11. In combination: a closed cycle helium refrigerator for maintaining, at cryogenic temperatures, an infrared laser diode having an output frequency that is dependent on the diode temperature, said refrigerator having a cold tip for receiving the laser diode, said refrigerator having a tendency to cause the temperature of the cold tip and laser diode to oscillate; a heat sink connected between the laser diode and the cold tip so that the only high conductivity thermal path between the laser diode and the cold tip is through the heat sink; a temperature sensing diode and a heater diode carried by the heat sink to be in close proximity with each other so that the sensing diode is at substantially the same temperature as the heater diode and substantially no thermal phase lag exists between the heater diode and the sensor diode, the temperature sensing diode being connected in circuit to be back biased by a regulated constant current source to derive a voltage indicative of the temperature of the cold tip, the impedance of the sensor diode decreasing as the temperature thereof increases so that the voltage derived from the sensor diode decreases as the temperature of the sensor diode increases; a DC amplifier; a capacitor connected between the sensor diode and DC amplifier to enable only AC fluctuations sensed by the sensor diode to be coupled to the amplifier, said amplifier having a variable gain controller and means for adjusting the DC output of the amplifier; a programmable constant current source responsive to the output of the amplifier, said programmable current source deriving a current level proportional to the amplitude of the voltage supplied to it by the amplifier; and means for connecting the heater diode to be back biased by the current derived from the current source so that the heater diode temperature decreases in response to decreases in the level of the current derived from the programmable current source, whereby the programmable current source derives a current that is a replica of the voltage derived from the sensor diode and the temperature of the heater diode decreases as the temperature of the laser diode increases in response to the cold tip temperature oscillations.

12. Apparatus for substantially eliminating tendencies of a load of a cold tip of a closed cycle helium refrigerator to thermally oscillate, comprising: a heater in a high conductivity thermal path with the cold tip; a temperature sensor in a high conductivity thermal path with the cold tip, the heater and the load so that the sensor is at substantially the same temperature as the heater and substantially no thermal phase lag exists between the heater and the sensor; and means for connecting the temperature sensor and the heater in a negative feedback circuit to compensate for temperature variations induced by the refrigerator in the load.

13. Apparatus for substantially eliminating tendencies of a load of a cold tip of a closed cycle helium refrigerator to thermally oscillate, comprising: a heat sink connected between the load and the cold tip so that the only high conductivity thermal path between the load and the cold tip is through the heat sink; a temperature sensor and an electric heater carried by the heat sink to be in close proximity with each other so that the sensor is at substantially the same temperature as the heater and substantially no thermal phase lag exists between the heater and the sensor; and means for connecting the temperature sensor and the heater in a negative feedback circuit to compensate for temperature variations induced by the refrigerator in the load.

14. The combination of claim 13 further including means for establishing a relatively high AC thermal conductivity path between the cold tip and the heat sink while establishing a relatively low DC thermal conductivity path between the cold tip and the heat sink.

15. The combination of claim 14 wherein the means for establishing includes a dielectric layer having a thickness of approximately one or two mils.

16. The combination of claim 15 wherein the means for establishing further includes a pair of relatively plastic plates of high thermal conductivity between which the dielectric layer is sandwiched, and means for compressing the plates against the dielectric layer so that the plates and layer are in intimate contact.

* * * * *